(12) United States Patent
Morita

(10) Patent No.: US 10,243,347 B2
(45) Date of Patent: Mar. 26, 2019

(54) ISOLATED DC POWER SUPPLY DEVICE

(71) Applicant: SONY CORPORATION, Tokyo (JP)

(72) Inventor: Tadashi Morita, Tokyo (JP)

(73) Assignee: SONY CORPORATION, Tokyo (JP)

( * ) Notice: Subject to any disclaimer, the term of this patent is extended or adjusted under 35 U.S.C. 154(b) by 193 days.

(21) Appl. No.: 15/323,131

(22) PCT Filed: Jul. 8, 2015

(86) PCT No.: PCT/JP2015/069657
§ 371 (c)(1),
(2) Date: Dec. 30, 2016

(87) PCT Pub. No.: WO2016/009917
PCT Pub. Date: Jan. 21, 2016

(65) Prior Publication Data
US 2017/0141561 A1 May 18, 2017

(30) Foreign Application Priority Data
Jul. 18, 2014 (JP) .................................. 2014-147493

(51) Int. Cl.
*H02H 3/00* (2006.01)
*H02H 3/16* (2006.01)
(Continued)

(52) U.S. Cl.
CPC ............. *H02H 3/16* (2013.01); *G01R 31/025* (2013.01); *G01R 31/40* (2013.01); *H02J 1/00* (2013.01);
(Continued)

(58) Field of Classification Search
USPC .......................................................... 361/45
See application file for complete search history.

(56) References Cited

U.S. PATENT DOCUMENTS 3,857,069 A * 12/1974 Howell .................... H02H 3/17
361/45
2002/0039026 A1* 4/2002 Stroth ................ G01R 31/3277
324/509
(Continued)

FOREIGN PATENT DOCUMENTS

JP 2011-015502 A 1/2011
JP 2011-205871 A 10/2011
(Continued)

*Primary Examiner* — Ronald W Leja
(74) *Attorney, Agent, or Firm* — Chip Law Group

(57) ABSTRACT

An isolated DC power supply device that supplies direct current (DC) power via a positive electrode line, a negative electrode line, and a neutral line to which a signal is applied, the isolated DC power supply device including: an amplifying unit configured to amplify the DC power; a receiving unit configured to detect an occurrence of a ground leakage current flowing to the positive electrode line or the negative electrode line, compare a voltage of the neutral point with a voltage of the signal of the neutral line and connect the neutral line with a ground point via a coil; and an impedance adjusting circuit configured to be installed between the amplifying unit and the receiving unit and adjust an impedance in a voltage range of the signal applied to the neutral line and in a voltage range other than the signal voltage range.

8 Claims, 6 Drawing Sheets

(51) Int. Cl.
*H02J 1/00* (2006.01)
*H02J 13/00* (2006.01)
*G01R 31/02* (2006.01)
*G01R 31/40* (2014.01)
*H02J 9/06* (2006.01)
*H03H 11/28* (2006.01)

(52) U.S. Cl.
CPC .............. *H02J 9/061* (2013.01); *H02J 13/00* (2013.01); *H03H 11/28* (2013.01)

(56) References Cited

U.S. PATENT DOCUMENTS

2015/0285871 A1* 10/2015 Pollard .................. H02M 1/32
324/107
2017/0141561 A1* 5/2017 Morita ..................... H02H 3/16

FOREIGN PATENT DOCUMENTS

| JP | 2012-078289 A | 4/2012 |
| JP | 2013-009482 A | 1/2013 |
| JP | 2013-090560 A | 5/2013 |

* cited by examiner

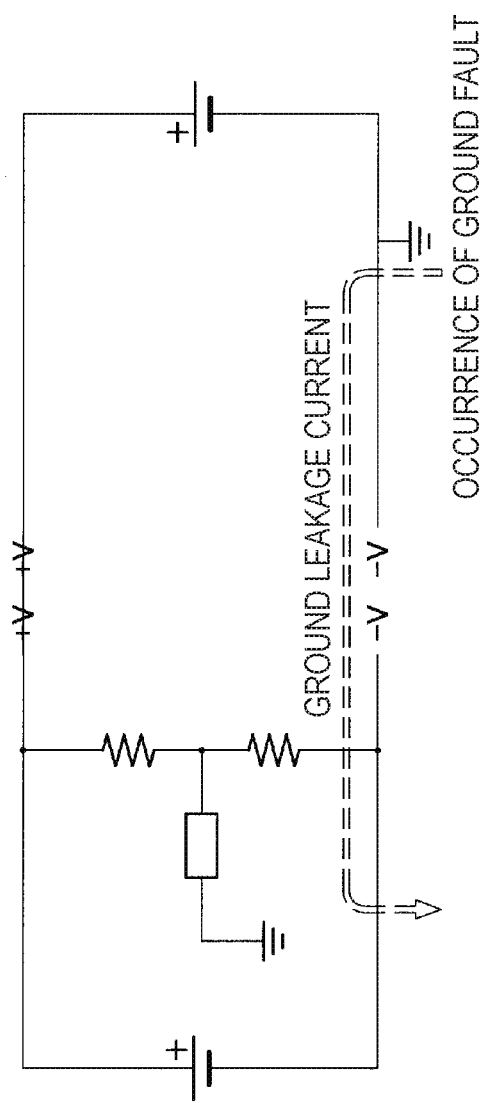

ISOLATED DC POWER SUPPLY DEVICE

CROSS REFERENCE TO RELATED APPLICATIONS

This application is a U.S. National Phase of International Patent Application No. PCT/JP2015/069657 filed on Jul. 8, 2015, which claims priority benefit of Japanese Patent Application No. JP 2014-147493 filed in the Japan Patent Office on Jul. 18, 2014. Each of the above-referenced applications is hereby incorporated herein by reference in its entirety.

TECHNICAL FIELD

The present disclosure relates to an isolated DC power supply device.

BACKGROUND ART

An uninterruptible power supply (UPS) device that is equipped with a storage battery and capable of continuously supplying electric power from the storage battery to a connected device during a predetermined period of time without power interruption even when electric power from an input power source is interrupted is known. A technique of extending such a power supply device to a consumer unit and supplying electric power to consumers when an abnormality such as power outage or insufficient capacity of a storage battery occurs in power supply has been proposed (see Patent Literatures 1 and 2).

CITATION LIST

Patent Literature

Patent Literature 1: JP 2011-205871A
Patent Literature 2: JP 2013-90560A

SUMMARY OF INVENTION

Technical Problem

When electric power is supplied among consumers, if power supply from the storage battery is considered, it is desirable to supply direct current (DC) power in terms of efficiency. Further, even when the DC power is transmitted and received, it is necessary to detect a ground fault and stop power supply safely.

In this regard, the present disclosure proposes an isolated DC power supply device, which is novel and improved and capable of efficiently using ground fault detection for safety protection and communication in a DC power supply network.

Solution to Problem

According to the present disclosure, there is provided an isolated DC power supply device that supplies direct current (DC) power via a positive electrode line to which a positive voltage is applied, a negative electrode line to which a negative voltage is applied, and a neutral line to which a signal is applied, the neutral line having an intermediate voltage between the positive electrode line and the negative electrode line as a neutral point, the isolated DC power supply device including: an amplifying unit configured to amplify the DC power; a receiving unit configured to detect an occurrence of a ground leakage current flowing to the positive electrode line or the negative electrode line, compare a voltage of the neutral point with a voltage of the signal of the neutral line and connect the neutral line with a ground point via a coil; and an impedance adjusting circuit configured to be installed between the amplifying unit and the receiving unit and adjust an impedance in a voltage range of the signal applied to the neutral line and a voltage range other than the signal voltage range in a manner that the impedance is set higher in the signal voltage range than in the other voltage range.

Advantageous Effects of Invention

As described above, according to the present disclosure, it is possible to provide an isolated DC power supply device, which is novel and improved and capable of efficiently using ground fault detection for safety protection and communication in a DC power supply network.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 7 is an explanatory diagram for describing a combination of a common ungrounded ground fault detecting circuit.

DESCRIPTION OF EMBODIMENT(S)

Figure 1:
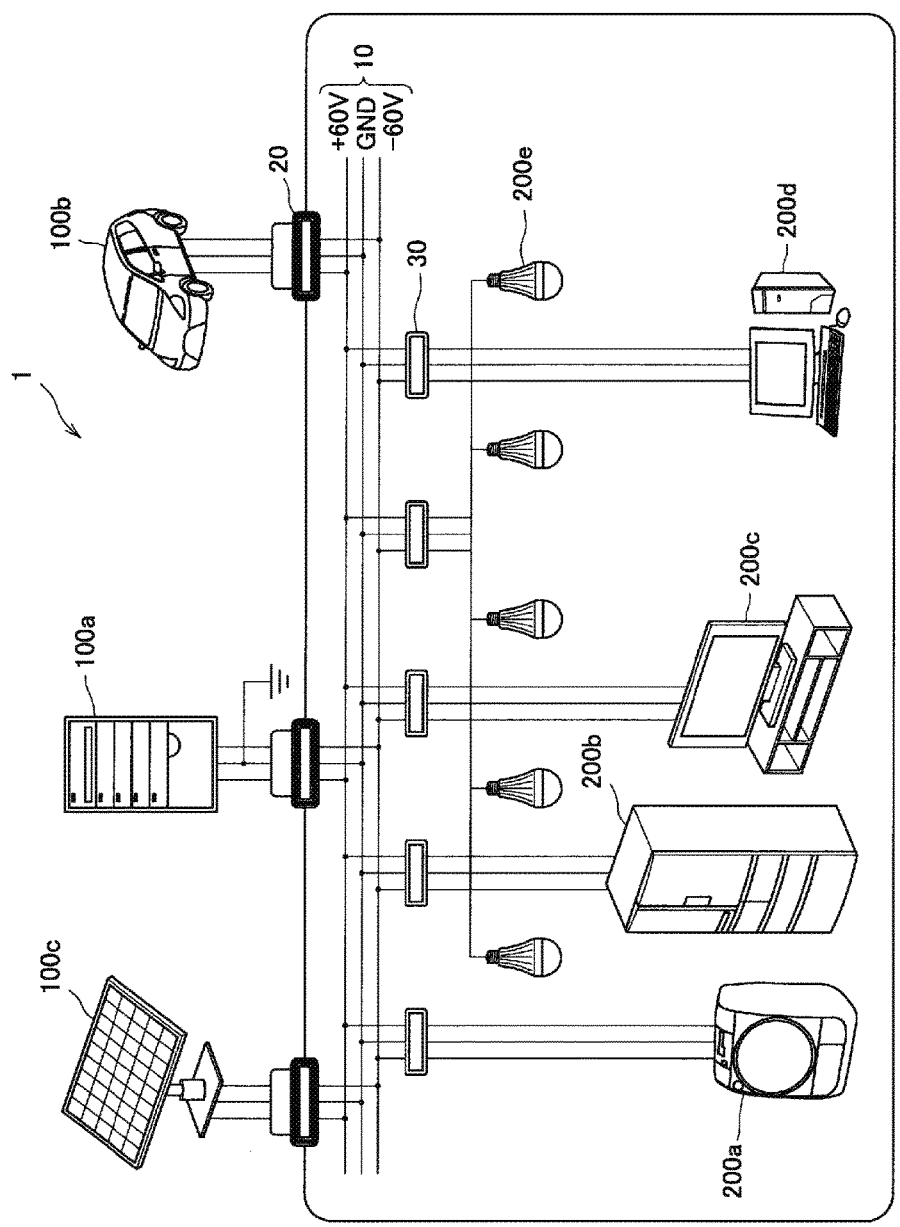
FIG. 1 is an explanatory diagram for describing an exemplary configuration of a DC power transmission/reception system (1) according to an embodiment of the present disclosure.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

The description will proceed in the following order.
1. Embodiment of present disclosure
1.1. Overview
1.2. Exemplary configuration
2. Conclusion

1. Embodiment of Present Disclosure

[1.1. Overview]

Before an embodiment of the present disclosure is described, an overview of an embodiment of the present disclosure will be described.

A system in which each consumer is provided with a battery server with a storage battery, electric power is stored in the storage battery using electric power generated by a commercial power source or natural energy such as sunlight, wind power, or geothermal energy, and electrical products are operated using the electric power stored in the storage battery is expected to be increasingly expanded in the future. A system in which, when electric power in a battery server of a certain consumer is insufficient, electric power is supplied from a battery server of a consumer having sufficient electric power to the battery server of the consumer having insufficient electric power has been proposed with the expansion of such a system as described above. When electric power is supplied between consumers, if power supply from the storage battery is considered, it is desirable to supply DC power in terms of efficiency.

In the existing alternating current (AC)-based power transmission and reception, when the occurrence of a ground fault is detected, a portion in which the ground fault is occurring is isolated from a power supply network, or power supply is safely stopped. Similarly to the existing AC-based power transmission and reception, even in DC power transmission and reception, it is necessary to detect the occurrence of a ground fault and isolate a portion in which the ground fault is occurring from a power supply network or stop power supply safely.

A number of ground fault detection techniques in DC power transmission and reception have been proposed to date. For example, in the case of DC power supply by one power supply device, there is a method of detecting the occurrence of a ground fault by making a neutral point in a power source, connecting the neutral point with the earth, and detecting an electric current flowing to the neutral point. However, when two or more power supply devices are installed, the neutral points are individually connected with the earth, the ground fault detection based on the ground leakage current by the other device is erroneously performed, or a ground fault current is divided, and detection sensitivity is lower.

A technique in which devices (for example, battery servers equipped with batteries) that transmit and receive DC power are provided with a communication function, and exchange with the other party that receives it totally, electric energy that is transmitted or received, a transmission/reception period of time, or the like when DC power is transmitted and received has already been proposed. Here, the existing battery server with the communication function appropriately performs charging or discharging by exchanging residual electric power or the like with other devices. However, for such a battery server, it is assumed that a voltage is used in a range in which a dangerous voltage is not exceeded, and special protection is required for a connection with a device in which a dangerous voltage is exceeded. In order to implement such special protection, it is necessary to increase the number of connections, and thus it is difficult to constitute a power network in a wide range.

As described above, in the DC power transmission and reception, a voltage within a range in which a dangerous voltage is not exceeded is used. However, there are cases in which a voltage within a range in which a dangerous voltage is not exceeded is insufficient to operate existing AC household electrical appliances with direct current, and it is necessary to vastly change power supply circuits installed in the existing AC household electrical appliances. Further, in the supply of DC power with a low voltage, even when the same electric power is transmitted, an electric current is increased, and power transmission loss by an increase in the electric current increases in proportion to the square of the electric current.

In an existing three-wire AC transmission network, a neutral line for reducing a voltage to ground is installed to increase safety. As a device that performs transmission and reception of data while transmitting electric power, for example, there is a power line communication (PLC) device in which a high frequency signal is superimposed on a power line, but noise or a frequency generated by a household device based on the high frequency signal is likely to have an influence on other devices. Further, since a frequency of AC power is set to 50 Hz to 60 Hz, impedance is too low to transmit data at a low frequency, and thus electric power used for communication is likely to be increased.

In this regard, the authors of the present disclosure have carried out intensive studies on a technique capable of efficiently using ground fault detection for safety protection and communication with low power consumption when DC power is transmitted and received. As a result, it led to the invention of a technique capable of efficiently using ground fault detection for safety protection and communication with low power consumption in a three-wire DC power transmission network as will be described below.

The overview of the embodiment of the present disclosure has been described above. Next, an exemplary configuration of an embodiment of the present disclosure will be described.

[1.2. Exemplary Configuration]

FIG. 1 is an explanatory diagram for describing an exemplary configuration of a DC power transmission/reception system 1 according to an embodiment of the present disclosure. An exemplary configuration of the DC power transmission/reception system 1 according to the embodiment of the present disclosure will be described below with reference to FIG. 1.

The DC power transmission/reception system 1 of FIG. 1 according to the embodiment of the present disclosure is a system that is configured to perform power supply using direct current. As illustrated in FIG. 1, the DC power transmission/reception system 1 according to the embodiment of the present disclosure includes DC power supply devices 100a, 100b, and 100c and DC power receiving devices 200a to 200e.

In FIG. 1, the DC power supply device 100a is illustrated as a battery server equipped with a battery, the DC power supply device 100b is illustrated as an electric vehicle, and the DC power supply device 100c is illustrated as a solar battery panel.

In FIG. 1, the DC power receiving device 200a is illustrated as a washing machine, the DC power receiving device 200b is illustrated as a refrigerator, the DC power receiving device 200c is illustrated as a television set, the DC power receiving device 200d is illustrated as a personal computer, and the DC power receiving device 200e is illustrated as electric lighting. All the DC power receiving devices 200a to 200e are devices that directly receive DC power and operate in a house.

In the DC power transmission/reception system 1 according to the embodiment of the present disclosure, the DC power is supplied from the DC power supply devices 100a, 100b, and 100c to the DC power receiving devices 200a to 200e via a DC bus line 10. In the present embodiment, the DC bus line 10 is configured with three lines, that is, a positive electrode line, a neutral line, and a negative electrode line. For example, a rated voltage of the positive electrode line is +60 V, a rated voltage of the negative electrode line is −60 V. It will be appreciated that the rated voltages of the positive electrode line and the negative electrode line are not limited to these examples.

Each of the DC power supply devices 100a, 100b, and 100c may be connected with the DC bus line 10 through a power supply connector 20. Each of the DC power receiving devices 200a to 200e may be connected with the DC bus line 10 through a DC plug 30. The power supply connector 20 and the DC plug 30 can have any shape and specifications as long as they can perform transmission and reception of DC power via the DC bus line 10.

In the DC power transmission/reception system 1 of FIG. 1 according to the embodiment of the present disclosure, only any one of the DC power supply devices 100a, 100b, and 100c that supply DC power may be configured to have the control authority for controlling transmission and reception of electric power to and from the DC bus line 10. For example, when the DC power is supplied to the DC power receiving device 200a via the DC bus line 10, the DC power supply device 100a may perform arbitration for securing the control authority with the DC power supply devices 100b and 100c, and when both of the DC power supply devices 100b and 100c obtain the control authority, the DC power supply device 100a may obtain the control authority and supply the DC power to the DC power receiving device 200a.

In the DC power transmission/reception system 1 of FIG. 1 according to the embodiment of the present disclosure, the neutral line to which the DC power supply device 100a serving as the battery server is connected is grounded at one point. In the DC power transmission/reception system, a position at which the neutral line is grounded is not limited to the position illustrated in FIG. 1, but the entire DC power transmission/reception system is grounded at one point regardless of a grounded position.

The exemplary configuration of the DC power transmission/reception system 1 according to the embodiment of the present disclosure has been described above with reference to FIG. 1. Next, an exemplary configuration of the DC power supply device 100a included in the DC power transmission/reception system 1 according to the embodiment of the present disclosure will be described.

Figure 2:
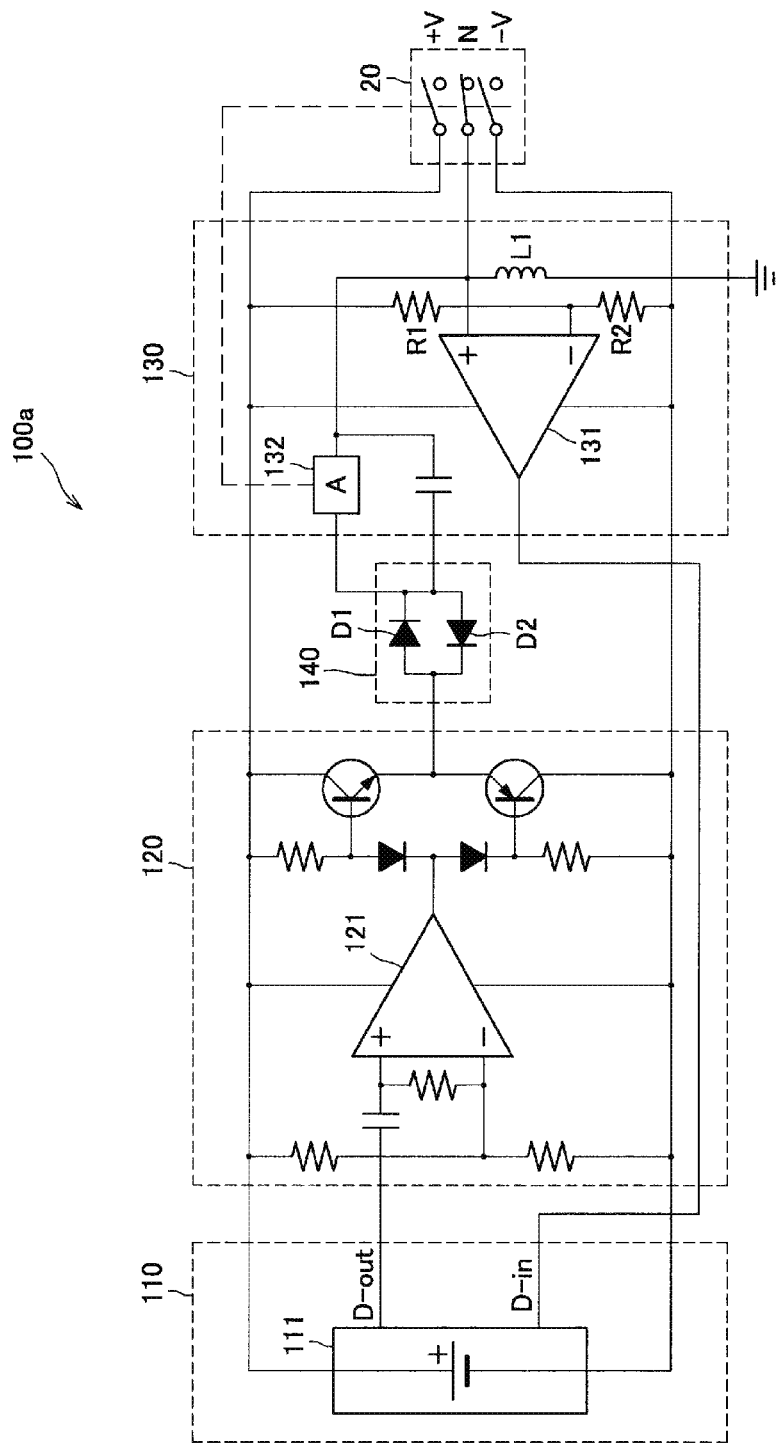
FIG. 2 is an explanatory diagram for describing an exemplary configuration of a DC power supply device (100a) included in the DC power transmission/reception system (1) according to the embodiment of the present disclosure.

FIG. 2 is an explanatory diagram for describing an exemplary configuration of the DC power supply device 100a included in the DC power transmission/reception system 1 according to the embodiment of the present disclosure. An exemplary configuration of the DC power supply device 100a included in the DC power transmission/reception system 1 according to the embodiment of the present disclosure will be described below with reference to FIG. 2.

The DC power supply device 100a includes a battery 110, an amplifying unit 120, a receiving unit 130, and an impedance adjusting circuit 140. In the present embodiment, the DC power supply device 100a is configured to be able to supply DC power of 120 V, and a voltage that can be supplied from the DC power supply device 100a is not limited to this example.

The battery 110 includes a battery unit 111. The battery unit 111 includes a secondary battery capable of performing charging and discharging and is configured to be able to store electric power, supply electric power from the DC power supply device 100a as necessary, and store electric power transmitted from other devices. The battery unit 111 is configured to output a predetermined signal to other devices and receive predetermined signals transmitted from other devices. A signal output from a D-out terminal of the battery unit 111 is transmitted to the amplifying unit 120 at a subsequent stage, and a signal output from the receiving unit 130 is transmitted to a D-in terminal of the battery unit 111.

The amplifying unit 120 receives the signal output from the battery unit 111, amplifies the signal by a predetermined amount, and outputs an amplified signal to the impedance adjusting circuit 140 at a subsequent stage. The amplifying unit 120 is configured to include a power amplifier circuit 121. The signal output from the battery unit 111 and a voltage of a middle point obtained by dividing voltages +V and −V output from the signal and the battery unit 111 are input to the power amplifier circuit 121. An output of the power amplifier circuit 121 is transmitted to the receiving unit 130 at a subsequent stage via the impedance adjusting circuit 140. In other words, the output of the power amplifier circuit 121 varies according to the signal output from the D-out terminal of the battery unit 111.

The receiving unit 130 sets a middle point obtained by dividing +V and −V as a reference, compares the reference voltage with a voltage of the neutral line N, and determines the content of a transmission signal to be transmitted through the neutral line based on a voltage change. The receiving unit 130 determines the content of the transmission signal to be transmitted through the neutral line based on a voltage change, and transmits the content of the transmission signal to the battery unit 111.

The receiving unit 130 is configured to include a power amplifier circuit 131 and an electric current detector 132. A voltage of a middle point obtained by dividing the voltages +V and −V output from the battery unit 111 by two resistors R1 and R2 and the transmission signal to be applied to the neutral line N are input to the power amplifier circuit 131. The power amplifier circuit 131 determines the content of the transmission signal to be transmitted through the neutral line based on a voltage change, and transmits the content of the transmission signal to the battery unit 111. The electric current detector 132 receives an output of the power amplifier circuit 121 included in the amplifying unit 120 and outputs a detection result on the output of the power amplifier circuit 121 to the neutral line N.

Then, when either of the positive electrode line and the negative electrode line of the DC bus line 10 has a ground fault, and the ground leakage current flows to the DC bus line 10, the electric current detector 132 detects the electric current, and cuts off power supply by the power supply connector 20. For example, a relay may be used to cut off the power supply by the power supply connector 20. When the ground leakage current flows to the DC bus line 10, the electric current detector 132 detects the ground leakage current, and cuts off the power supply by the power supply connector 20, and thus the DC power supply device 100a can be protected from damage such as fire damage that may be caused when the ground fault occurs.

The impedance adjusting circuit 140 is installed between the amplifying unit 120 and the receiving unit 130 as illustrated in FIG. 2. A role of the impedance adjusting circuit 140 is to adjust an impedance in a voltage range of the transmission signal applied to the neutral line N and in a voltage range other than the signal voltage range so that the impedance is set higher in the signal voltage range than in the other voltage range.

In FIG. 2, the impedance adjusting circuit 140 is configured with two diodes D1 and D2. The two diodes D1 and D2 are installed such that a pair of diodes are installed in opposite directions, that is, a direction from the amplifying unit 120 to the receiving unit 130 and a direction from the receiving unit 130 to the amplifying unit 120 as illustrated in FIG. 2.

When data is transmitted via the neutral line of the DC bus line 10, the DC power supply device 100a illustrated in FIG. 2 increases an output voltage of the power amplifier circuit 121 to be higher than a threshold voltage of the diodes D1 and D2 of the impedance adjusting circuit 140, and transmits the data.

On the other hand, when the DC power supply device 100a illustrated in FIG. 2 receives data from another device, for example, the DC power supply device 100b, via the neutral line of the DC bus line 10, the output of the power amplifier circuit 121 is maintained to be half (½) of the electric power of the battery 110, and the power amplifier circuit 121 is isolated from the input of the receiving unit 130 through the diodes D1 and D2 of the impedance adjusting circuit 140. Then, when data is received via the neutral line of the DC bus line 10, the DC power supply device 100a sets an impedance higher within the range of the threshold voltage of the diodes D1 and D2 of the impedance adjusting circuit 140.

By adjusting the output of the power amplifier circuit 121 as described above, the DC power supply device 100a illustrated in FIG. 2 can perform data transmission at low transmission power when data is transmitted via the neutral line of the DC bus line 10. Further, by adjusting the output of the power amplifier circuit 121 as described above, the DC power supply device 100a illustrated in FIG. 2 isolates the power amplifier circuit 121 from the receiving unit 130 when data is received via the neutral line of the DC bus line 10.

Instead of a diode, another element, for example, a transistor, may be used as the impedance adjusting circuit 140 as long as it adjust an impedance in the voltage range of the transmission signal applied to the neutral line N and in the voltage range other than the signal voltage range so that the impedance is set higher in the signal voltage range than in the other voltage range.

The output of the electric current detector 132 and the neutral line N are grounded via a coil L1. When the neutral line N is installed, and long wiring is performed using a method of oscillating positive and negative power voltages through the transmission signal, there are cases in which a rising edge waveform of a digital signal is deformed due to floating capacitance existing in a wiring path.

However, in the DC power supply device 100a illustrated in FIG. 2, the output of the electric current detector 132 and the neutral line N are grounded via the coil L1, and thus when the signal transmitted from the DC power supply device 100a has a basic frequency of a certain value or more, the neutral line N is isolated from the ground at the frequency, and the signal can be transmitted via the neutral line N.

In the DC power supply device 100a illustrated in FIG. 2, the coil L1 is inserted between the earth ground and the neutral line N. The coil L1 has a characteristic in that alternating current is not passed, but direct current is passed. Thus, the DC power supply device 100a illustrated in FIG. 2 has no influence on detection of an electric shock, a ground fault, or the like and can reliably transmit data using a modulation scheme of data having no DC component.

Figure 3:
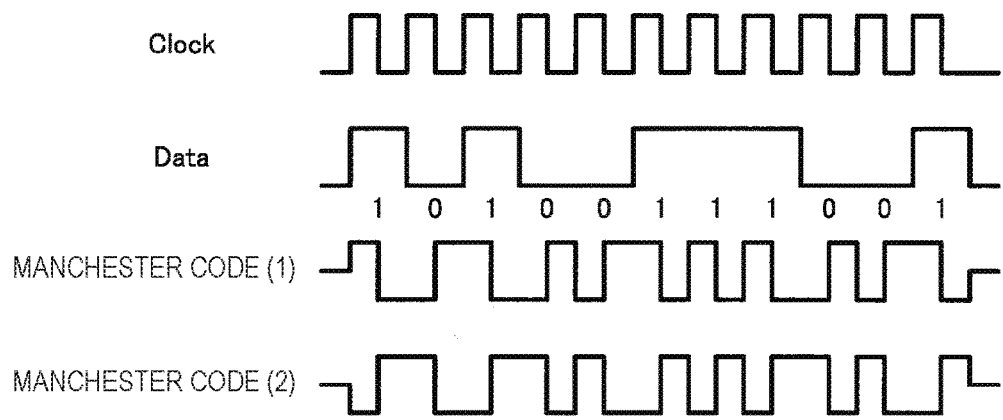
FIG. 3 is an explanatory diagram for describing an example of a Manchester code.

For example, the Manchester code may be used as a modulation scheme of data having no DC component. FIG. 3 is an explanatory diagram for describing an example of the Manchester code. Using a code in which a DC component is excluded such as the Manchester code, an accumulated voltage of the neutral point is halved (½).

Figure 4:
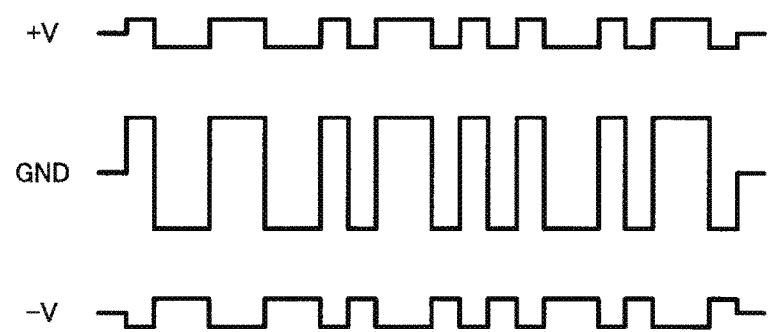
FIG. 4 is an explanatory diagram for describing an example of voltage changes in positive and negative electrodes and a neutral line with reference to earth ground.

FIG. 4 is an explanatory diagram for describing an example of voltage changes in the positive and negative electrodes and the neutral line with reference to the earth ground. In the DC power supply device 100a illustrated in FIG. 2, the coil L1 is inserted between the neutral line N and the ground point. Thus, using data having no DC component for transmission and reception of data, a digital signal appears at the neutral point, and a part thereof also appears at both ends of the positive and negative electrodes as illustrated in FIG. 4.

Figure 5:
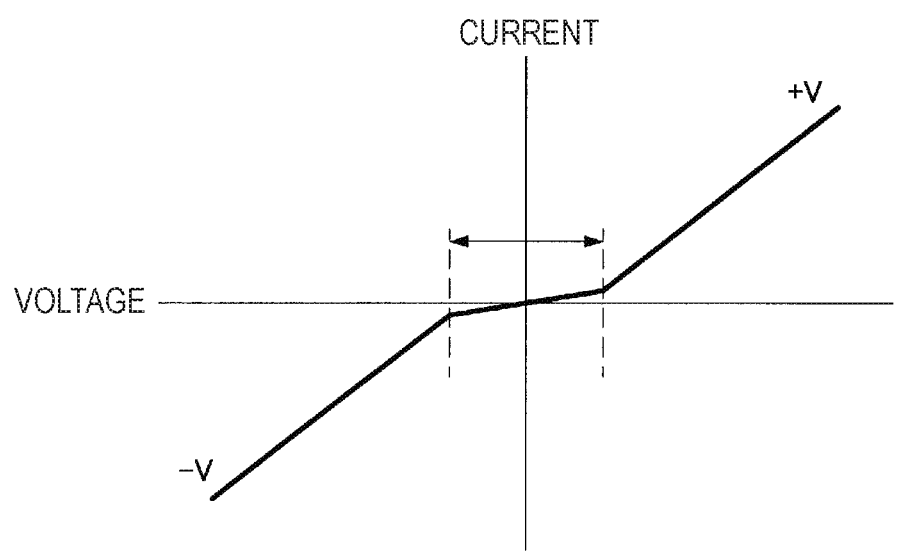
FIG. 5 is an explanatory diagram for describing an example of changes in a voltage and an electric current of a neutral point.

FIG. 5 is an explanatory diagram for describing an example of changes in a voltage and an electric current of the neutral point. Due to the impedance adjusting circuit 140 connected to the output of the power amplifier circuit 121, a change in an electric current is small near at a voltage of 0 V, that is, in a communication voltage range, and a large electric current flows when a voltage exceeds a certain value. Since a large electric current flows when a voltage of the neutral point exceeds a certain value, communication can be performed at low electric power in the communication voltage range, and an operation can be performed at electric power at which the ground fault detecting circuit can be sufficiently operated at a voltage other than the communication voltage range.

The DC power supply device 100a has the configuration illustrated in FIG. 2, and thus a potential difference between the positive electrode line and the negative electrode line seen from the neutral line N or the earth ground is half (½) the voltage supplied via the positive electrode line and the negative electrode line. Thus, since the DC power supply device 100a has the configuration illustrated in FIG. 2, even when a human body comes into contact with any one of the positive electrode line and the negative electrode line, it is possible to reduce a risk of an electric shock.

Figure 6:
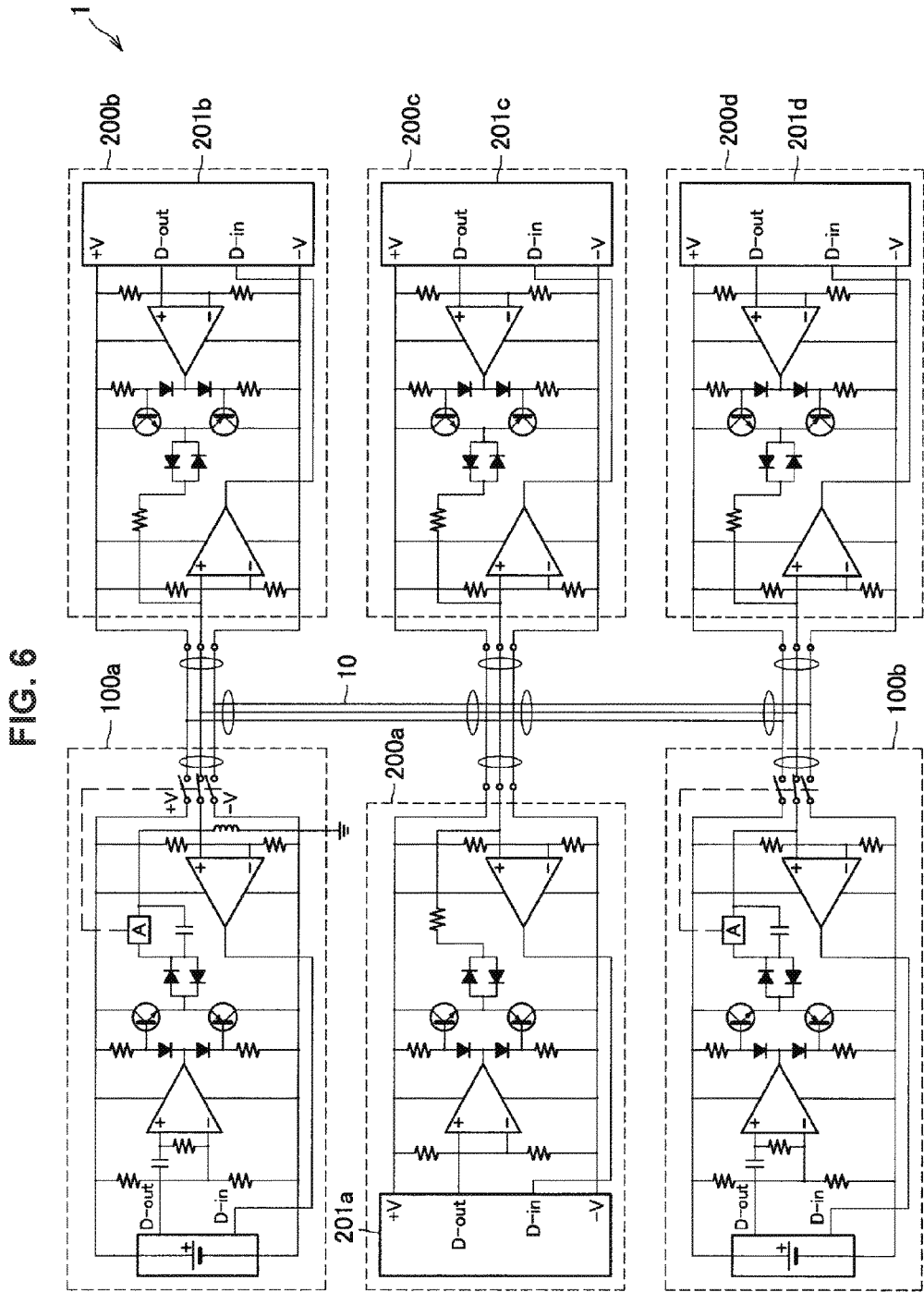
FIG. 6 is an explanatory diagram for describing an exemplary configuration of the DC power transmission/reception system (1).

FIG. 6 is an explanatory diagram for describing an exemplary configuration of the DC power transmission/reception system 1 when the DC power is supplied to the DC power receiving devices 200a to 200d via the DC bus line 10 through the two DC power supply devices 100a and 100b. The DC power receiving devices 200a to 200d illustrated in FIG. 6 include operation units 201a to 201d that receive the DC power and operate. Each of the operation units 201a to 201d includes a D-out terminal that outputs a signal to the neutral line of the DC bus line 10 and a D-in terminal that receives a signal transmitted via the neutral line of the DC bus line 10.

When a plurality of DC power sources and a plurality of DC power supply destinations are connected to the DC bus line 10 as described above, inter-device communication can be performed via the neutral line of the DC bus line 10, and a collaborative operation can be also performed via the DC bus line 10 among a plurality of DC power sources or between a DC power source and a DC power supply destination.

As a collaborative operation performed via the DC bus line 10 among a plurality of DC power sources, for example, there is arbitration of the control authority by the DC power supply devices 100a and 100b. Further, as a collaborative operation performed via the DC bus line 10 between the DC power source and the DC power supply destination, for example, there is an instruction to instruct an operation in a power saving mode which is issued from the DC power supply device 100*a* to the DC power receiving device 200*a*.

The DC power transmission/reception system 1 illustrated in FIG. 6 is grounded at only one position of the DC power supply device 100*a*. Although the entire system is grounded at only one position, when either of the positive electrode line and the negative electrode line of the DC bus line 10 has the ground fault, the ground fault can be detected through the electric current detector installed in the DC power supply device 100*b*, and electric power can be cut off, similarly to when the electric power is supplied through only one DC power supply device 100*a*.

2. Conclusion

As described above, according to the embodiment of the present disclosure, the isolated DC power supply device 100*a* capable of efficiently using the ground fault detection for the safety protection and communication with other devices in the DC power supply network is provided.

In the DC power supply device 100*a* according to the embodiment of the present disclosure, the neutral line is connected with the earth ground with the coil interposed therebetween, and data can be reliably transmitted using the modulation scheme of data having no DC component without lowering the detection accuracy of an electric shock, a ground fault, and the like. Further, in the DC power supply device 100*a* according to the embodiment of the present disclosure, even when another ungrounded DC power supply device is connected to the DC bus line 10, the ground fault detection can be safely performed, and communication with other devices can be performed using the neutral point. In the DC power supply device 100*a* according to the embodiment of the present disclosure, it is possible to issue an instruction to perform charging/discharging switching with another ungrounded DC power supply device via the neutral line for the ground fault detection.

In the DC power supply device 100*a* according to the embodiment of the present disclosure, it is possible to lower a voltage between a voltage at which an existing AC device can be operated with a direct current without change and the earth ground to be a dangerous voltage or less and supply the voltage while suppressing a transmission voltage to be half (½) of a ground voltage. Further, it is also possible to divert an electric distribution network by switching the DC bus line 10 to an existing three-wire AC power network without change.

FIG. 7 is an explanatory diagram for describing a combination of a common ungrounded ground fault detecting circuit. When the ground fault detecting circuit is attached to each of two power supply devices, an electric current flowing when the ground fault occurs is halved (½), and the detection sensitivity of the ground fault is lowered. Further, when the ground leakage current is generated by other devices or the like, an erroneous operation is likely to be performed at the time of the ground fault detection.

On the other hand, in the DC power transmission/reception system 1 according to the embodiment of the present disclosure, transmission and reception of DC power are performed via the DC bus line 10 based on a DC three-wire system, and it is grounded at only one point, and thus a reduction in the detection sensitivity and the ground fault and an erroneous operation at the time of the ground fault detection can be prevented.

In the DC power supply device 100*a* according to the embodiment of the present disclosure, the impedance adjusting circuit 140 is installed between the amplifying unit 120 and the receiving unit 130, and an impedance of the impedance adjusting circuit 140 is adjusted so that an impedance at the time of transmission of data is different from an impedance at the time of reception of data, for example, the impedance is adjusted to be low at the time of transmission and high at the time of reception.

In the DC power supply device 100*a* according to the embodiment of the present disclosure, the modulation scheme of data having no DC component is used as a modulation scheme of data when transmission and reception of data with other devices are performed using the neutral line.

As described above, an impedance of the impedance adjusting circuit 140 is adjusted so that the impedance at the time of transmission of data is different from the impedance at the time of reception of data, and the modulation scheme of data having no DC component is used as the modulation scheme, and thus in the DC power supply device 100*a* according to the embodiment of the present disclosure, it is possible to reliably transmit data to other devices at low power consumption using the neutral line.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art based on the description of this specification.

Additionally, the present technology may also be configured as below.

(1)

An isolated DC power supply device that supplies direct current (DC) power via a positive electrode line to which a positive voltage is applied, a negative electrode line to which a negative voltage is applied, and a neutral line to which a signal is applied, the neutral line having an intermediate voltage between the positive electrode line and the negative electrode line as a neutral point, the isolated DC power supply device including:

an amplifying unit configured to amplify the DC power;

a receiving unit configured to detect an occurrence of a ground leakage current flowing to the positive electrode line or the negative electrode line, compare a voltage of the neutral point with a voltage of the signal of the neutral line and connect the neutral line with a ground point via a coil; and an impedance adjusting circuit configured to be installed between the amplifying unit and the receiving unit and adjust an impedance in a voltage range of the signal applied to the neutral line and a voltage range other than the signal voltage range in a manner that the impedance is set higher in the signal voltage range than in the other voltage range.

(2)

The isolated DC power supply device according to (1), wherein the signal is a signal including no DC component.

(3)

The isolated DC power supply device according to (2), wherein the signal is a signal using a Manchester code.

(4)

The isolated DC power supply device according to any of (1) to (3),
wherein the impedance adjusting circuit is comprising a diode.

(5)

The isolated DC power supply device according to (4),
wherein the amplifying unit increases an output to be higher than a threshold voltage of the diode when the signal is transmitted via the neutral line and decreases an output to be half a voltage supplied via the positive electrode line and the negative electrode line when the signal is received through the receiving unit.

(6)

The isolated DC power supply device according to (4) or (5),
wherein the amplifying unit decreases an output to half of a voltage supplied via the positive electrode line and the negative electrode line when the signal is received through the receiving unit.

(7)

The isolated DC power supply device according to any of (1) to (3),
wherein the impedance adjusting circuit is comprising a field effect transistor.

(8)

The isolated DC power supply device according to any of (1) to (7), further including
a battery configured to supply a DC power via the positive electrode line and the negative electrode line,
wherein the signal applied to the neutral line includes information related to transmission or reception of the DC power by the battery.

REFERENCE SIGNS LIST

1 DC power transmission/reception system
10 DC bus line
20 power supply connector
30 DC plug
100a DC power supply device
110 battery
111 battery unit
120 amplifying unit
121 power amplifier circuit
130 receiving unit
131 power amplifier circuit
132 electric current detector
140 impedance adjusting circuit
200a DC power receiving device

The invention claimed is:

1. An isolated DC power supply device that supplies direct current (DC) power via a positive electrode line to which a positive voltage is applied, a negative electrode line to which a negative voltage is applied, and a neutral line to which a signal is applied, the neutral line having an intermediate voltage between the positive electrode line and the negative electrode line as a neutral point, the isolated DC power supply device comprising:
an amplifying unit configured to amplify a DC power;
a receiving unit configured to detect an occurrence of a ground leakage current flowing to the positive electrode line or the negative electrode line, compare a voltage of the neutral point with a voltage of the signal of the neutral line, and connect the neutral line with a ground point via a coil; and
an impedance adjusting circuit configured to be installed between the amplifying unit and the receiving unit, wherein impedance adjusting circuit is configured to adjust an impedance in a voltage range of the signal applied to the neutral line and in a voltage range other than the voltage range of the signal in a manner that the impedance is set higher in the voltage range of the signal than in the other voltage range.

2. The isolated DC power supply device according to claim 1,
wherein the signal includes no DC component.

3. The isolated DC power supply device according to claim 2,
wherein the signal uses a Manchester code.

4. The isolated DC power supply device according to claim 1,
wherein the impedance adjusting circuit comprises a diode.

5. The isolated DC power supply device according to claim 4,
wherein the amplifying unit is configured to increase an output compared with a threshold voltage of the diode when the signal is transmitted via the neutral line.

6. The isolated DC power supply device according to claim 4,
wherein the amplifying unit is further configured to decrease an output to half of a voltage supplied via the positive electrode line and the negative electrode line when the signal is received through the receiving unit.

7. The isolated DC power supply device according to claim 1,
wherein the impedance adjusting circuit comprises a field effect transistor.

8. The isolated DC power supply device according to claim 1, further comprising
a battery configured to supply the DC power via the positive electrode line and the negative electrode line,
wherein the signal applied to the neutral line includes information related to one of transmission or reception of the DC power by the battery.

* * * * *